United States Patent
Happ et al.

(10) Patent No.: US 7,337,282 B2
(45) Date of Patent: Feb. 26, 2008

(54) MEMORY SYSTEM AND PROCESS FOR CONTROLLING A MEMORY COMPONENT TO ACHIEVE DIFFERENT KINDS OF MEMORY CHARACTERISTICS ON ONE AND THE SAME MEMORY COMPONENT

(75) Inventors: Thomas D. Happ, Tarrytown, NY (US); Michael Kund, Tuntenhausen (DE); Ralf Symanczyk, Tutenhausen (DE)

(73) Assignee: Infineon Technologies AG, Munich (DE)

(*) Notice: Subject to any disclaimer, the term of this patent is extended or adjusted under 35 U.S.C. 154(b) by 114 days.

(21) Appl. No.: 10/722,576

(22) Filed: Nov. 28, 2003

(65) Prior Publication Data

US 2005/0120186 A1    Jun. 2, 2005

(51) Int. Cl.
*G06F 12/00* (2006.01)
(52) U.S. Cl. ............... 711/154; 711/163; 711/103; 711/102
(58) Field of Classification Search ........ 711/154, 711/163, 103, 102, 104
See application file for complete search history.

(56) References Cited

U.S. PATENT DOCUMENTS

| | | | |
|---|---|---|---|
| 4,380,803 A * | 4/1983 | Tuan | 365/183 |
| 5,706,225 A * | 1/1998 | Buchenrieder et al. | 365/102 |
| 5,768,182 A * | 6/1998 | Hu et al. | 365/145 |
| 5,910,911 A * | 6/1999 | Sekiguchi et al. | 365/145 |
| 2002/0127886 A1 * | 9/2002 | Moore et al. | 438/800 |
| 2003/0084233 A1 | 5/2003 | Williams | |

OTHER PUBLICATIONS

Hirose, Y. et al. (1976). "Polarity-dependent Memory Switching and Behavior of Ag Dendrite in Ag-photodoped Amorphous $As_2S_3$ Films," *Journal of Applied Physics* 47(6):2767-2772.
Kozicki, M. N. et al. (1999). "Application of Programmable Resistance Changes in Metal-doped Chalcogenides," *Electrochemical Society Proceedings* 99(13):298-309.
Kozicki, M. N. et al. (2000). "Nanoscale Effects in Devices Based on Chalcogenide Solid Solutions," *Superlattices and Microstructures* 27(5/6):485-488.
Kozicki, M. N. et al. (2002). "Can Solid State Electrochemistry Eliminate the Memory Scaling Quandry," *Proc. VLSI* 15 pages.
Neale, R. (2002). "Micron to Look Again at Non-volatile Amorphous Memory," *Electronic Engineering Design* 6 pages.

* cited by examiner

*Primary Examiner*—Kimberly McLean
(74) *Attorney, Agent, or Firm*—Slater & Matsil, L.L.P.

(57) ABSTRACT

According to the invention, a memory system, and a process for controlling a memory component, to achieve different kinds of memory characteristics on one and the same memory component, is provided, the process comprising the steps:
Sending out a signal to select one of several possible modes for the memory component; and
Operating the memory component in accordance with the specific mode selected by the signal.

17 Claims, 1 Drawing Sheet

FIG 1
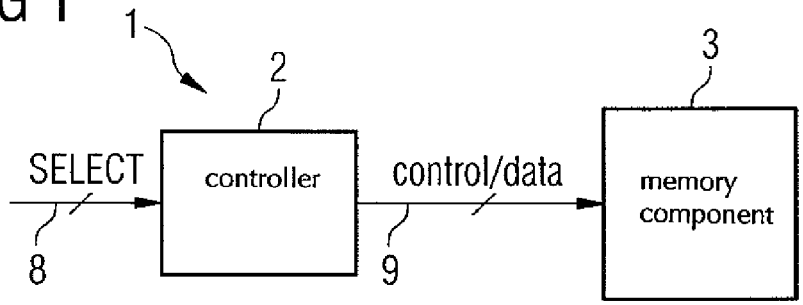
FIG 2
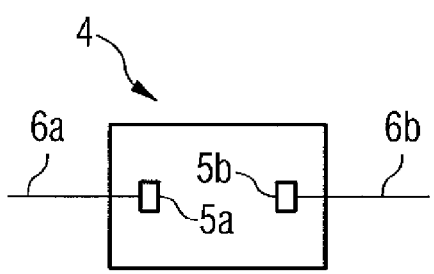
FIG 3
| SELECT-signal | memory mode |
|---|---|
| 01 | Soft writing |
| 10 | Non-volatile writing |
| 11 | Hard writing |
FIG 4
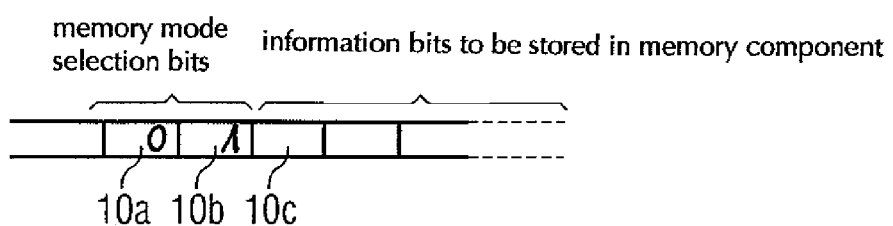

MEMORY SYSTEM AND PROCESS FOR CONTROLLING A MEMORY COMPONENT TO ACHIEVE DIFFERENT KINDS OF MEMORY CHARACTERISTICS ON ONE AND THE SAME MEMORY COMPONENT

TECHNICAL FIELD OF THE INVENTION

The invention refers to a memory system, and a process for controlling a memory component, in particular, to a process which allows to achieve different kinds of memory characteristics on one and the same memory component.

BACKGROUND OF THE INVENTION

In memory components, in particular, semi-conductor memory components, a distinction is made between so-called functional memory components (e.g. PLAs, PALS, etc.), and so called tab memory components, e.g. ROM components (ROM=Read Only Memory),—for example PROMS, EPROMs, EEPROMs, and Flash-memories—, and RAM components (RAM=Random Access Memory), e.g. DRAMS or SRAMs.

A RAM component is a memory device in which data is stored under a specific address, from which the data can be read out again later.

Because a RAM component needs to be provided with as many storage cells as possible, it becomes important for the creation of these cells to be kept as simple as possible.

With so-called SRAMs (SRAM=Static Random Access Memory) the individual memory cells for instance consist of a few, e.g. six transistors, and in so-called DRAMs (DRAM=Dynamic Random Access Memory) of only a single suitably controlled capacitance (e.g. the gate source capacitance of a MOSFET), with which in form of a charge one bit at a time can be stored.

In the case of DRAMS, this charge only persists for a short period of time, which means that a so-called "refresh" must be performed regularly, e.g. ca. every 64 ms.

In contrast thereto, in the case of SRAMs, the charge need not to be refreshed, i.e., the respective data remains stored on the cell as long as a respective supply voltage is fed to the SRAM.

ROM components (ROM=Read only memory), for example PROMS, EPROMs, EEPROMs, and Flash-memories, are memory components on which the respective data remains stored even after the respective supply voltage is turned off.

In general, and during the normal use of a ROM component, only read operations are performed, and no write operations.

In order to write data onto ROMs, e.g., PROMS, EPROMs, EEPROMs, etc. (i.e., in order to "program" the ROM), in many cases, special instruments have to be used.

Just as is the case for RAMS, the typical read access times, and the times it takes to write data onto the ROMs may differ between the different types of ROMs.

Due to the above-mentioned differences between e.g. RAM and ROM memory components, etc., and due to the differences mentioned between the different types of e.g. RAMs and ROMs, etc. (and due to further differences not mentioned herein), in general, depending on the particular memory characteristics needed for a particular application, the particular memory component which best fulfills the specific needs of a specific application is chosen for the particular application.

If two or more different memory characteristics are necessary for one and the same application, two or more different types of memory components are used, increasing the seize, the complexity, and the costs of the application.

In addition to the memory components mentioned above, e.g. so-called PMC memory components are known in the art (PMC=programmable metallization cell).

In a PMC memory cell, during the programming of the cell, a metallic dendrite between respective electrodes—depending on whether a logic "1", or a logic "0" shall be written into the cell—is either built up, or dissolved.

Hence, the contents of the PMC memory cell is defined by the respective resistance between the electrodes.

The resistance between the electrodes is controlled by suitable pulses applied to the electrodes of the PMC memory cell, thereby causing suitable electrochemical reactions which lead to the building up, or dissolution of the above-mentioned metallic connection between the electrodes.

PMC memory cells are e.g. disclosed in Y. Hirose, H. Hirose, J. Appl. Phys. 47, 2767 (1975), M. N. Kozicki, M. Yun, L. Hilt, A. Singh, Electrochemical Society Proc., Vol. 99-13, (1999) 298, and e.g. in M. N. Kozicki, M. Yun, S. J. Yang, J. P. Aberouette, J. P. Bird., Superlattices and Microstructures, Vol. 27, No. 5/6 (2000) 485-488, as well as e.g. M. N. Kozicki, M. Mitkova, J. Zhu, M. Park, C. Gopalan, "Can Solid State Electrochemistry Eliminate the Memory Scaling Quandry", Proc. VLSI (2002), and e.g. R. Neale: "Micron to look again at non-volatile amorphous memory", Electronic Engineering Design (2002), etc., the contents of these documents being incorporated herein by reference.

SUMMARY OF THE INVENTION

The invention relates to a memory system, and process for controlling a memory component, in particular, a process which allows to achieve different kinds of memory characteristics on one and the same memory component.

According to one embodiment of the invention, there is a process for controlling a memory component including sending out a signal to select one of several possible modes for the memory component; and operating the memory component in accordance with the specific mode selected by the signal.

According to another embodiment of the invention, a memory system comprises:

a memory component, and a controller, the controller being adapted to operate the memory component in one of several possible modes.

Hence, instead of one single memory component—two or more memory components of different types have to be used.

Therefore, the seize, the complexity, and the costs of the system might be reduced.

BRIEF DESCRIPTION OF THE DRAWINGS

These and other features, aspects and advantages of the present invention will be more fully understood when considered with respect to the following detailed description, appended claims and accompanying drawings, wherein:

FIG. 1 shows a memory system, with a controller, and a memory component according to a first embodiment of the invention.

FIG. 2 shows one of the several memory cells of the memory component shown in FIG. 1;

FIG. 3 is an exemplary table showing possible modes which might be chosen for the memory system of FIG. 1, and respective bits assigned thereto to codify the respectively selected mode.

FIG. 4 is an example for a data format which might be used to transmit data, and indicate the selected memory mode in a further embodiment of the invention.

DETAILED DESCRIPTION OF THE INVENTION

FIG. 1 shows a simplified, schematic block diagram of a memory system 1, with a controller 2 and a memory component 3.

The controller 2 may be built in form of a component which is separate from the memory component 3, or—alternatively—the controller 2 and the memory component 3 may be built on one and the same semi-conductor component.

The memory component 3 may e.g. be a PMC memory component (PMC=programmable metallization cell), e.g. a PMC memory component as described in e.g. Y. Hirose, H. Hirose, J. Appl. Phys. 47, 2767 (1975), M. N. Kozicki, M. Yun, L. Hilt, A. Singh, Electrochemical Society Proc., Vol. 99-13, (1999) 298, and e.g. in M. N. Kozicki, M. Yun, S. J. Yang, J. P. Aberouette, J. P. Bird, Superlattices and Microstructures, Vol. 27, No. 5/6 (2000) 485-488, as well as e.g. M. N. Kozicki, M. Mitkova, J. Zhu, M. Park, C. Gopalan, "Can Solid State Electrochemistry Eliminate the Memory Scaling Quandry", Proc. VLSI (2002), and e.g. R. Neale: "Micron to look again at nonvolatile amorphous memory", Electronic Engineering Design (2002), etc., the contents of these documents being incorporated herein by reference.

In the memory component 3—after a corresponding address was applied to respective address pins or address input pads (not shown) of the memory component 3 (or of the respective semiconductor component additionally comprising the controller 2)—data may be stored under the respective address, and may later on be read out again under this address. For inputting and outputting of the data, data pins, or data input/output pads (I/Os or Input/outputs, respectively) are provided, e.g. 16 data pins (e.g. on the memory component 3, or the respective semi-conductor component additionally comprising the controller 2).

By applying a corresponding signal (e.g. a read/write signal) to a write/read selection pin or pad, respectively, which is not illustrated here, it can be selected whether data is to be stored in, or to be read out of the memory component 3.

The data input into the memory component 3 is stored there in corresponding memory cells as defined by the above address, and is later on read out again from the corresponding memory cells.

The memory cells might e.g. be PMC memory cells 4 (PMC=programmable metallization cell), e.g. with a cell size of 1 um×1 um or e.g. 0.5 um×0.5 um, or e.g. a bigger or smaller seize, e.g. smaller than 100 nm×100 nm, etc.

A PMC memory cell 4 comprises—as is e.g. shown in FIG. 2 two or more electrodes 5a, 5b, used as e.g. anode(s), and cathode(s).

During the programming of the cell 4, i.e., the storing of data in the cell 4, a metallic connection/dendrite between respective electrodes 5a, 5b is either built up, or dissolved (depending on whether a logic "1", or a logic "0" shall be written into the cell 4).

Hence, the contents of the respective memory cell 4 is defined by the respective resistance between the electrodes 5a, 5b (which can be measured via respective lines 6a, 6b connected with the respective electrodes 5a, 5b, e.g. by—by use of the lines 6a, 6b—applying a voltage between the electrodes 5a, 5b, and measuring whether or not a current or a current above a predetermined value then flows between the line 6a, the electrode 5a, and the electrode 5b, and the line 6b).

The resistance between the electrodes 5a, 5b is controlled by suitable programming pulses (write pulses or negative pulses) on respective control lines connected with the PMC memory cell 4 (here—again—the lines 6a, 6b connected with the electrodes 5a, 5b), thereby causing suitable electrochemical reactions which lead—in the case of a PMC memory cell—to the building up, or dissolution of the above-mentioned metallic dendrite between the electrodes 5a, 5b.

Instead of PMC memory cells 4 (and a PMC memory component 3), a different memory component with different cells using a different resistive switching mechanism may be used, also.

As a metal for the metallic connection, any suitable metal may be used, e.g. copper (CU), or e.g. silver (Ag), etc.

A large number of the above memory cells 4 is arranged—in the form of respective rows and columns—in one or more rectangular or square arrays, so that e.g. 32 MBit, 64 MBit, 128 MBit, 256 MBit, 512 MBit, or 1024 MBit ("1 Gbit"), etc. of data can be stored in a respective array (depending on the number of memory cells 4 contained therein).

The memory system 1 comprising the memory component 3, and the controller 2 is connected to one or more devices (not shown), e.g. one or several processors, or other semiconductor devices, etc., which—under control of the controller 2—make use of the memory component 1 to store data therein, and to later on read out the stored data.

The device or devices, e.g. processor or processors, are connected to the memory system 1, e.g. the controller 2 and/or the memory component 3, via several lines (e.g. being a part of or being connected with a bus system), e.g. several address and/or data and/or read/write selection lines, etc., which e.g. may be connected with the above address pins and/or data pins, and/or the above read/write selection pin, etc.

Additionally, as is shown in FIG. 1, and as will be described in further detail below, the device or devices, e.g. processor or processors, may in a first embodiment be connected to the memory system 1, e.g. the controller 2 and/or the memory component 3, via one or more separate memory system mode selection lines 8 (as well e.g. being a part of or being connected with the above bus system).

A respective signal (here: a memory system mode selection signal (SELECT-Signal)) as put out by the device or the devices on the memory system mode selection lines 8 is—as is shown in FIG. 1—transmitted to the controller 2, so as to select one of several possible memory modes—e.g. a "soft writing mode", a "non-volatile writing mode", or a "hard writing mode", etc. (see as well FIG. 3)—for the memory system 1 (in this embodiment, for the specific data being transmitted—to the memory system 1 on the respective data lines simultaneously or shortly after the respective SELECT-Signal, the data to be stored in the memory system 1).

The respective memory modes might be encoded in the SELECT-Signal as e.g. shown in FIG. 3.

Each of several dual numbers (encoded by one or several respective bits (here: the numbers "01", "10", "11", etc.)) is assigned to a particular memory mode (here: the number "01" to the "soft writing mode", the number "10" to the "non-volatile writing mode", and the number "11" to the "hard writing mode", etc.,) and the respective number is—as a SELECT-Signal—transmitted by the respective device to the controller 2 via the above mode selection lines 8 to chose the mode as desired by the device for the particular data sent simultaneously or shortly after the respective SELECT-Signal.

Instead of using the above separate mode selection lines 8, and the above SELECT-Signal transmitted thereon, alternatively, several other ways or methods may applied by the respective device(s), e.g., processors, to indicate the respectively desired memory mode to the controller 2. For instance, the respective information might be transmitted from the respective device or devices, e.g. processor or processors, over the above—ordinary—data lines (which are connected with the above data pins of the memory system 1/controller 2).

Thereby, e.g. a data format as e.g. shown in FIG. 4 may be used.

As is shown in FIG. 4, the bit stream transferred from the respective device or devices to the memory system 1/the controller 2 comprises a header or control portion (here: one or more memory mode selection bits 10a, 10b, etc.), and an additional portion e.g. comprising the bits 10c carrying the actual information, i.e., the data to be stored on the memory component 3. The memory mode selection bits 10a, 10b are located at predefined positions within the bit stream (e.g., at the first and second position, etc.).

By the above memory mode selection bits 10a, 10b, it is encoded which memory mode is to be used by the memory system 1/the controller 2 for the information bits loc to follow the memory mode selection bits 10a, 10b (till e.g. the next memory mode selection bits are being sent out, e.g., for a predetermined number of bits following the memory mode selection bits 10a, 10b, etc.).

For the memory mode selection bits 10a, 10b, a similar code might be used as e.g. described with respect to FIG. 3. For instance, a "soft writing mode" might e.g. be indicated by the first memory mode selection bit 10a being "0", and the second memory mode selection bit lob being "1", a "nonvolatile writing mode" might e.g. be indicated by the first memory mode selection bit 10a being "1", and the second memory mode selection bit lob being "0", and a "hard writing mode" might e.g. be indicated by the first and second memory mode selection bits 10a, 10b both being "1", etc.

After the respective memory mode has been indicated, the controller 2—by sending out corresponding control and/or data signals on respective control and/or data lines 9 to the memory component 3—controls the storage of the data on the memory component 3 in accordance with the selected memory mode.

This is done by suitably adjusting the duration and/or the height and/or the number of programming pulses applied on respective (control) lines 6a, 6b connected with the memory cell 4 on which the data is to be stored (see FIG. 2).

E.g., when a "soft writing" is to be performed, one or more relatively short programming pulses of a relatively low intensity is/are applied to the respective memory cell 4 (e.g. one or several pulses with a current intensity of e.g. between 0.5 uA and 10 uA, in particular between 1 uA and 51 uA, in particular, with a current intensity of e.g. 2 uA, and a duration between e.g. 50 ns and 200 us, in particular, e.g. 14 us).

Further, when e.g. a "non-volatile writing" is to be performed, one or more pulses of medium intensity and a medium duration is/are applied to the respective memory cell 4 (e.g. one or several pulses with a current intensity of e.g. between 5 uA and 50 uA, in particular between 20 uA and 40 uA, e.g. with a current intensity of 250 uA, and a duration between e.g. 100 ns and 500 us, in particular, e.g. 20 us).

In addition, when e.g. a "hard-writing" is to be performed, one or more relatively long programming pulses of a relatively high intensity is/are applied to the respective memory cell 4 (e.g. one or several pulses with a current intensity of e.g. between 20 uA and 150 uA, in particular, with a current intensity higher than 50 uA, e.g. 80 uA, and a duration between e.g. 1 us and 1 s, in particular, e.g. 100 us).

In other words, whether a "soft writing", a "non-volatile writing", or a "hard-writing" are performed depends on the amount of charge that flows, i.e., the product of the above current intensity, and the (total) duration of the applied pulse(s).

The above mentioned values for the current, and the (total) duration of the applied pulses refer to a cell size of about 1 um×1 um. If different cell sizes are used, correspondingly amended values for the current intensity, and the (total) duration of the applied pulses shall be used.

When a "soft writing" is performed, and one or more of the above relatively short programming pulses is/are applied to the respective memory cell 4, only a small amount of metal is precipitated/plated out in the memory cell 4 due to the shortness and/or weakness of the respective electrochemical reactions caused by the pulse/pulses.

Due to the shortness of the programming pulse(s), the write time is relatively small, hence, in this mode, a high number of cycles may be performed in a particular time. In addition, the power consumption is relatively low. Further, due to the small amount of metal precipitated/plated out in the memory cell 4, the respective data only remains stored in the memory cell for a relatively short period of time (e.g., between 2 hours and 10 days, e.g., between 1 and 3 days, etc.). Further, new data might be written on the memory cell 4 whenever appropriate, thereby erasing the old data.

Hence, in this mode ("soft writing mode"), the memory component 3 (or parts thereof) may e.g. be used as main or working memory, e.g. for the above processor(s) (the other parts of the memory component 3 e.g. being used for a "nonvolatile writing", and/or a "hard writing", etc.).

When a "non-volatile writing" is performed, and one or more of the above programming pulses of the above medium intensity and medium duration is/are applied to the respective memory cell 4,—due to the higher amount of charge transported, i.e., the higher amount of ion migration—more metal is precipitated/plated out in the memory cell 4 than is the case in the "soft writing mode".

Hence, the write time is longer, than is the case in the "soft writing mode". Therefore, in this mode, a lower number of cycles may be performed in a particular time than is the case in the "soft writing mode". In addition, the power consumption is higher. However, due to the higher amount of metal precipitated/plated out in the memory cell 4, the respective data remains stored in the memory cell for a relatively long period of time (e.g., between 1 month and several years, in particular, between 1 year and 20 years, e.g. 10 years, etc.).

Still, the amount of metal precipitated/plated out in the memory cell 4 is low enough to allow new data to be written on the memory cell 4 whenever appropriate, thereby erasing the old data. Therefore, in this mode ("non-volatile writing mode"), the memory component (or parts thereof) may be used as NVM (nonvolatile memory), e.g. as NVM for the above processor(s), or other electronic devices.

In contrast thereto, when a "hard writing" is performed, and one or more of the above programming pulses of the above high intensity and high duration is/are applied to the respective memory cell 4,—due to the even higher amount of charge transported, i.e., the even higher amount of ion migration—even more metal is precipitated/plated out in the memory cell 4 than is the case in the "non-volatile writing mode".

Hence, the write time is even longer, than is the case in the "non-volatile writing mode". Therefore, a lower number of cycles may be performed in a particular time. In addition, the power consumption is higher.

However, the respective data stored in the memory cell 4 by the above "hard writing process" is non-erasable ("one-time writing"), i.e., cannot be changed in future cycles.

This is the case because—in the case of a hard-written "1" (i.e., a metallic connection being present between the electrodes 5a, 5b)—during the "hard writing", the cathode of the memory cell 4 is flooded by/overflown with elementary metal. When it is later on tried to erase the data, the respective current is constantly lead over a metallic path in form of a stream of electrons; hence, no metal is dissolved, and the data remains stored. Further, in the "hard writing mode", during the "hard-writing" of a "1", metal is deposited on the anode, which leads to the two electrodes 5a, 5b then essentially being reactively symmetric, avoiding that a hard-written "1" may be changed in future cycles.

Reversely,—in the case of a hard-written "0" (i.e., no metallic connection being present between the electrodes 5a, 5b)—during the "hard writing" the solid electrolyte material is freed from metallic Ions (Ag-, Cu-Ions, etc.) to such an extent that the threshold voltage of the cell gets so high that by only applying the normal supply voltage to the cell (and not a much higher voltage), no writing is possible.

The respective data is therefore non-erasable, and remains stored on the memory cell 4 even longer, than is the case in the above "non-volatile writing" process (e.g., more than 5 or 10 years, etc.).

Therefore, in the above "hard writing mode", the memory component (or parts thereof) may be used as an OTP (OTP=One Time Programmable Memory), e.g. as OTP for the above processor(s), or other electronic devices, e.g. to—nonerasably—store program code, serial numbers, cryptographic keys, etc., or other security-relevant data.

The specific use of the memory component 3 (as e.g. working memory, NVM, or OTP, etc.) might hence be flexibly chosen during operation.

Hence, it might be e.g. avoided that—instead of the memory component 3—two or more memory components of different types have to be used.

Therefore, the seize, the complexity, and the costs of the system might be reduced.

While certain exemplary embodiments have been described in detail and shown in the accompanying drawings, it is to be understood that such embodiments are merely illustrative of and not restrictive on the broad invention. It will thus be recognized that various modifications may be made to the illustrated and other embodiments of the invention, without departing from the scope and spirit of the invention as defined by the appended claims.

What is claimed is:

1. A process for controlling the operating mode of a Programmable Metallization Cell (PMC) memory component having first and second electrodes, comprising:
   providing a signal to select one of at least three modes for the PMC memory component;
   providing a programming pulse with a selected current intensity to the PMC memory component in accordance with the specific mode selected by the signal to change the resistance between said first and second electrodes; and
   bringing a PMC memory cell of the PMC memory component into a selected state of storage permanence in response to the current intensity of said programming pulse applied to the PMC memory cell.

2. The process of claim 1, further comprising writing data into the memory component in accordance with the specific mode selected by the signal.

3. The process of claim 2, whereby one of the modes is a soft writing mode.

4. The process of claim 2, whereby one of the modes is a non-volatile writing mode.

5. The process of claim 2, whereby one of the modes is a hard writing mode.

6. The process of claim 2, whereby writing of data into the memory component, is determined by a current intensity, a duration of the programming pulse adapted, and/or the number of programming pulses.

7. The process of claim 1, whereby the signal is sent out over one or several separate mode selection lines.

8. The process of claim 1, whereby the signal is sent out over the same line as actual data to be stored in the memory component.

9. The process of claim 8, whereby the signal is sent out over the line by use of memory mode selection bits, the bits being followed by bits carrying the data to be stored in the memory component.

10. The process of claim 1, wherein said programming provide forms or dissolves a metallic dendrite connection between said first and second electrodes depending on whether a logic "1" or a logic "0" is written in the PMC.

11. A memory system, comprising:
    a Programmable Metallization Cell (PMC) memory; component having a first and second electrodes; and
    a controller for selecting one of several different operating modes for the memory component by forming or dissolving a metallic dendrite connection in a memory cell of the memory component to change the resistance between the first and second electrode and resulting in different storage permanence by providing a correspondingly selected current intensity of a programming pulse applied to the memory cell.

12. The system of claim 11, whereby one of the modes is a soft writing mode.

13. The system of claim 11, whereby one of the modes is a non-volatile writing mode.

14. The system of claim 11, whereby one of the modes is a hard writing mode.

15. A process for controlling a Programmable Metallization (PMC) memory component having first and second electrodes comprising:
    sending out a signal to select one of several modes for the PMC memory component;
    providing a programming pulse with a selected duration to the PMC memory component in accordance with the mode selected by the signal, wherein to change the resistance between said first and second electrodes; and bringing a PMC memory cell of the PMC memory component into a selected state of storage permanence in response to the duration of a programming pulse applied to the PMC memory cell.

16. The process of claim 15, wherein said programming provide forms or dissolves a metallic dendrite connection between said first and second electrodes depending on whether a logic "1" or a logic "0" is written in the PMC.

17. A memory system, comprising:
a Programmable Metallization Cell (PMC) memory component having first and second electrodes; and
a controller for selecting one of several different operating modes for the memory component by forming or dissolving a metallic dendrite connection in the memory component to change the resistance between said first and second electrodes and resulting in different storage permanence by providing a correspondingly selected duration of a programming pulse applied to the memory cell.

* * * * *

UNITED STATES PATENT AND TRADEMARK OFFICE
CERTIFICATE OF CORRECTION

PATENT NO. : 7,337,282 B2 Page 1 of 1
APPLICATION NO. : 10/722576
DATED : February 26, 2008
INVENTOR(S) : Happ et al.

It is certified that error appears in the above-identified patent and that said Letters Patent is hereby corrected as shown below:

In Col. 2, line 4, delete "seize" and insert --size--.
In Col. 2, line 55, delete "seize" and insert --size--.
In Col. 3, line 17, after "in" insert --the--.
In Col. 3, line 59, delete "seize" and insert --size--.
In Col. 4, line 50, after "well" insert --as--.
In Col. 5, line 5, delete "chose" and insert --choose--.
In Col. 5, line 11, after "may" insert --be--.
In Col. 5, line 33, delete "loc" and insert --10c--.
In Col. 5, line 42, delete "lob" and insert --10b--.
In Col. 5, line 45, delete "lob" and insert --10b--.
In Col. 7, line 25, delete "lead" and insert --led--.
In Col. 7, line 58, delete "seize" and insert --size--.
In Col. 8, line 27, after "pulse" delete "adapted".
In Col. 8, line 66, after "signal," delete "wherein".

Signed and Sealed this

Eighth Day of July, 2008

JON W. DUDAS
*Director of the United States Patent and Trademark Office*